United States Patent
Wu et al.

(10) Patent No.: US 9,820,382 B2
(45) Date of Patent: Nov. 14, 2017

(54) CONNECTOR AND CONNECTOR ASSEMBLY

(71) Applicant: Tyco Electronics (Shanghai) Co. Ltd., Shanghai (CN)

(72) Inventors: Honghao Wu, Shanghai (CN); Marshall Chen, Shanghai (CN); Tim Xue, Shanghai (CN); Polly Liu, Shanghai (CN); Helena Sun, Shanghai (CN)

(73) Assignee: Tyco Electronics (Shanghai) Co. Ltd., Shanghai (CN)

(*) Notice: Subject to any disclaimer, the term of this patent is extended or adjusted under 35 U.S.C. 154(b) by 0 days.

(21) Appl. No.: 14/676,074

(22) Filed: Apr. 1, 2015

(65) Prior Publication Data

US 2015/0289407 A1    Oct. 8, 2015

(30) Foreign Application Priority Data

Apr. 4, 2014 (CN) .................. 2014 1 01353918

(51) Int. Cl.
| | |
|---|---|
| H05K 1/00 | (2006.01) |
| H05K 1/18 | (2006.01) |
| G02B 6/42 | (2006.01) |
| H01R 13/518 | (2006.01) |

(52) U.S. Cl.
CPC ............. H05K 1/18 (2013.01); G02B 6/428 (2013.01); G02B 6/4261 (2013.01); G02B 6/4269 (2013.01); H01R 13/518 (2013.01); H05K 2201/09063 (2013.01); H05K 2201/10189 (2013.01)

(58) Field of Classification Search
CPC .... G02B 6/4269; H05K 7/202; H05K 7/2039; H05K 7/20409; H05K 7/20563; H05K 7/20572; H05K 7/20854
USPC ....... 174/252; 361/704, 679.46, 679.54, 690, 361/709; 439/341, 485, 607.2, 607.28
See application file for complete search history.

(56) References Cited

U.S. PATENT DOCUMENTS

| | | | | |
|---|---|---|---|---|
| 4,587,593 A | * | 5/1986 | Liautaud ............ | H05K 7/20854 361/690 |
| 7,601,021 B1 | * | 10/2009 | Yang .................... | G02B 6/0008 439/487 |
| 2005/0037655 A1 | * | 2/2005 | Henry .............. | H01R 13/65802 439/341 |
| 2005/0195565 A1 | * | 9/2005 | Bright ................ | H05K 7/20418 361/688 |
| 2007/0183128 A1 | * | 8/2007 | Pirillis ................. | H05K 9/0058 361/715 |
| 2008/0102699 A1 | * | 5/2008 | Chen .................... | G02B 6/4277 439/607.01 |
| 2010/0254112 A1 | * | 10/2010 | Brown ................ | G02B 6/4201 361/818 |
| 2011/0013365 A1 | * | 1/2011 | Oota .................... | B62D 5/0406 361/707 |
| 2011/0053415 A1 | * | 3/2011 | Fonteneau ........... | H05K 9/0058 439/607.01 |

(Continued)

*Primary Examiner* — Steven T Sawyer
(74) *Attorney, Agent, or Firm* — Barley Snyder

(57) ABSTRACT

A connector is provided and includes a bottom, a top case positioned above the bottom case, and a partition is positioned between the top case and the bottom case. A plurality of ports is provided between the top case and the bottom case and the ports are separated by the partition. A temperature exchange device is mounted on the bottom case.

21 Claims, 14 Drawing Sheets

(56) References Cited

U.S. PATENT DOCUMENTS

2012/0257355 A1\* 10/2012 Yi .................. G02B 6/4269
  361/704
2013/0118781 A1\* 5/2013 Hwang ............... F28F 9/007
  174/252

\* cited by examiner

CONNECTOR AND CONNECTOR ASSEMBLY

CROSS-REFERENCE TO RELATED APPLICATIONS

This application claims the benefit of the filing date under 35 U.S.C. §119(a)-(d) of Chinese Patent Application No. 201410135391.8 filed on Apr. 4, 2014.

FIELD OF THE INVENTION

The invention relates to a connector assembly and, more particularly, to a connector assembly having a connector and an electrical apparatus.

BACKGROUND

Small Form Factor (SFF) connectors are generally known and may include a male light module (a male connector) and a female case module (a female connector) mated with the male light module. The male light module has a power of 1.0~4.0 Watts and generates heat during use.

In order to cool the male light module, as shown in FIGS. 1-4, a known the female connector includes a bottom case 100, a top case 200, a partition 300, a plurality of temperature exchange devices 400, a clamp 500 and a light guide pipe 600. Each temperature exchange device 400 is disposed on one corresponding port 1 of the known female connector, as shown in FIGS. 1-4. The temperature exchange device 400 is mounted in an opening 210 formed in the top case 200. When the male light module (not shown) is inserted into the port 1 of the known female connector, a bottom surface of the temperature exchange device 400 contacts a top surface of the male light module, and the heat from the male light module is transferred to the temperature exchange device 400 and dissipated outside. The clamp 500 holds the temperature exchange device 400 to position the temperature exchange device 400 in a front-rear direction and in an upper-down direction with a spring structure. Before the male light module is inserted into the port 1 of the known female connector, the spring structure 520 (see FIGS. 2-3) presses the temperature exchange device 400 to the lowest position defined by a top surface of the top case 200. After the male light module is inserted into the port 1 of the female connector, the male light module pushes the temperature exchange device 400 upward, and the spring structure 520 presses the temperature exchange device 400 downward against the male light module. In this way, the temperature exchange device 400 reliably contacts the male light module, reducing the thermal contact resistance between the contact surfaces of them.

As shown in FIGS. 1-4, the known connector requires the clamp 500 to hold the temperature exchange device 400. The clamp 500 increases the cost, and a support arm 510 (see FIGS. 2-3) of the clamp 500 blocks an air flow and decreases the heat dissipating performance. In the prior art, the air flow may flow in a left-right direction or a front-rear direction of the connector. If the air flow flows in the left-right direction of the connector, the clamp 500 decreases the performance of the temperature exchange device most. Analysis results show that the support arm 510 of the temperature exchange device 500 reduces the heat dissipating performance by about 7%~8%. Furthermore, since the temperature exchange device 400 is disposed only on the top case 200, the heat dissipating performance thereof is limited. Furthermore, in some severe environment, the temperature exchange device 400 on the top case 200 cannot satisfy cooling requirements.

Furthermore, in some conditions, a space between the top surface of the female connector and a housing of an electrical apparatus (in which the female connector is assembled) is very limited, especially, in a case where the housing is very compact or the female connector has multi-layer ports. For example, as shown in FIGS. 5-6, a known female connector includes a bottom base 10, a top case 20 and a partition 30, and the female connector has two layers of ports 1 (in each of which a contact 2 is received).

As for the known female connector with multi-layer ports 1 shown in FIGS. 5-6, the following problems may be occurred. For instance, the space above the top case is not large enough to mount a top layer of temperature exchange devices on the top case, especially for the female connector with multi-layer ports, because of the height of the multi-layer connector is greater than the height of a single-layer connector. Thereby, the space between the multi-layer connector and the top wall of the housing is very limited, in this case, there may be not provided any temperature exchange device on the connector, for example the multi-layer connector shown in FIGS. 5-6. In addition, the temperature exchange device with lowest height is provided in the limited space between the multi-layer connector and the top wall of the housing, and the light guide pipe is also provided in the limited space. The light guide pipe has a height substantially equal to the height of the temperature exchange device, and the light guide pipe blocks an air flow toward the fin of the temperature exchange device, it causes the temperature exchange device cannot play the convection heat transfer effect. Analysis results show that heat dissipating performance of the temperature exchange device is reduced by more than 21%.

As for the above identified problems, they cannot be solved by providing the temperature exchange device on the top case. However, in the prior art, except for the solution of providing the temperature exchange device on the top case, there is not any other solution to dissipate the heat, it causes the cooling design of the connector or the electrical apparatus failed.

SUMMARY

The present invention has been made to overcome or alleviate an aspect of the above mentioned disadvantages.

According to an object of the invention, among others, is to provide a connector having a bottom, a top case positioned above the bottom case, and a partition is positioned between the top case and the bottom case. A plurality of ports is provided between the top case and the bottom case and the ports are separated by the partition. A temperature exchange device is mounted on the bottom case.

BRIEF DESCRIPTION OF THE DRAWINGS

The above and other features of the present invention will become more apparent by describing in detail exemplary embodiments thereof with reference to the accompanying drawings, in which.

DETAILED DESCRIPTION OF THE EMBODIMENT(S)

Figure 1:
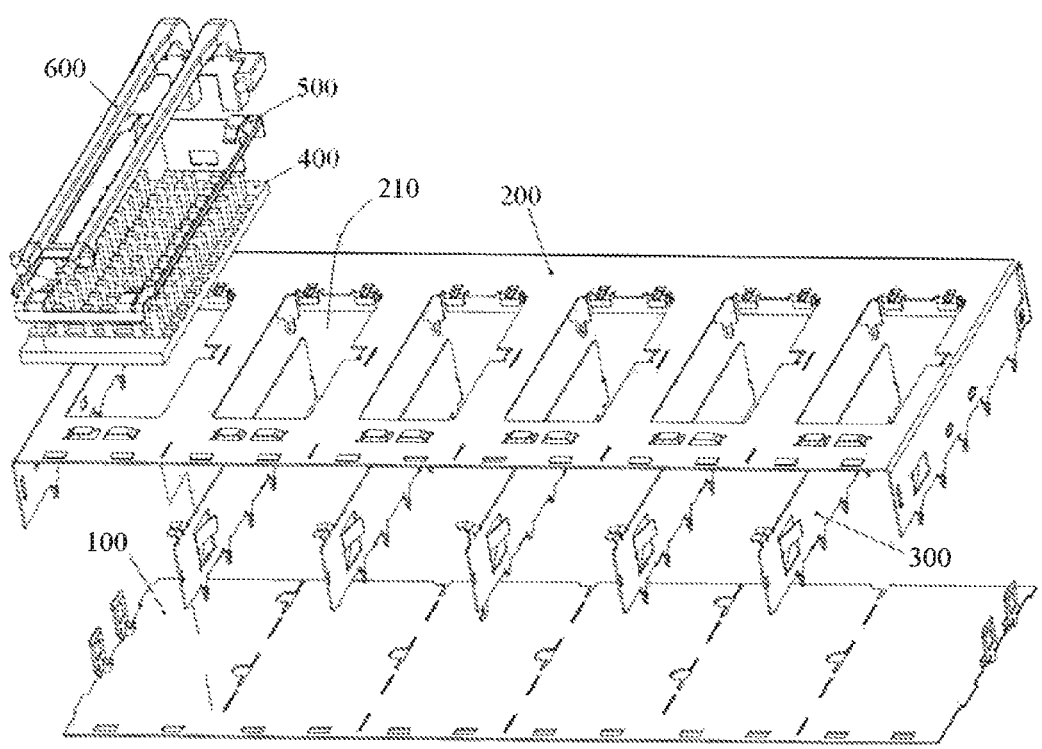
FIG. 1 is an exploded perspective view of a known connector.
Figure 2:
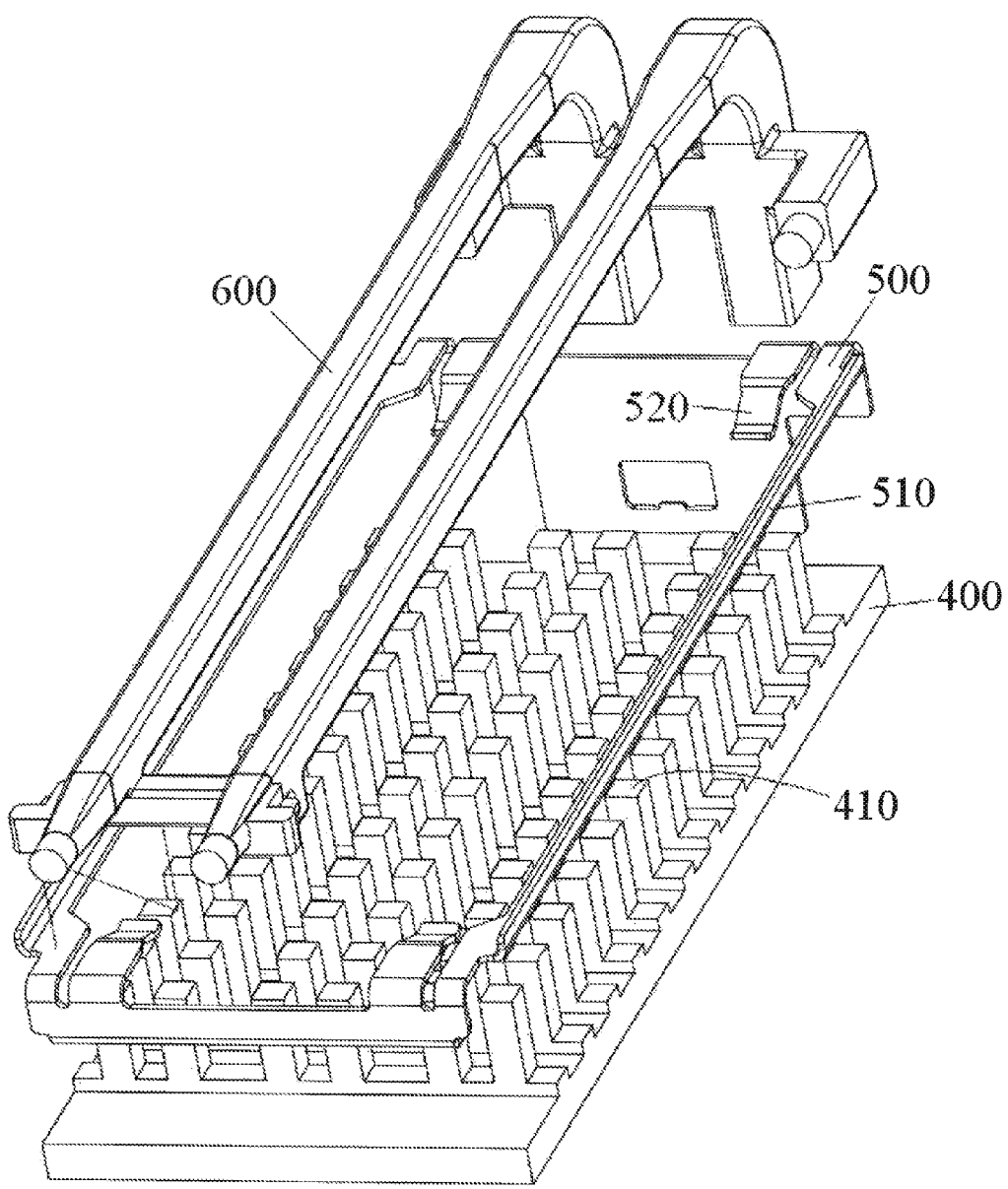
FIG. 2 is an enlarged perspective view of a temperature exchange device, a clamp and a light guide pipe of the known connector shown in FIG. 1.
Figure 3:
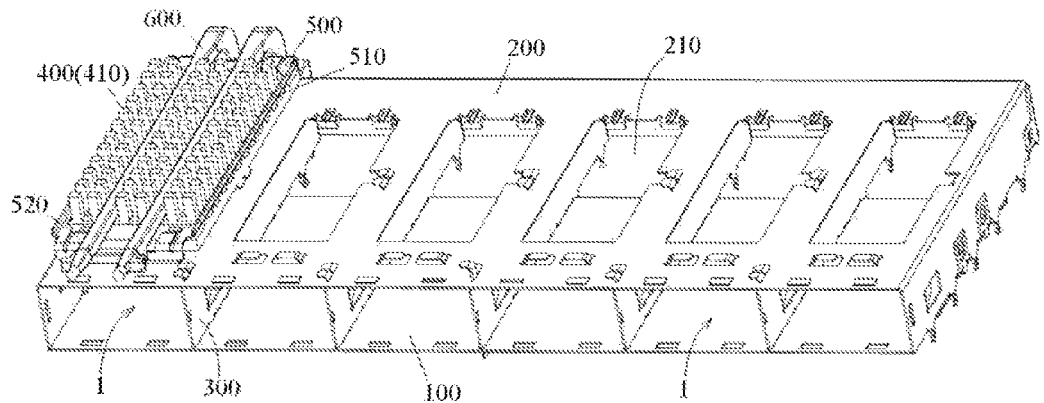
FIG. 3 is an assembled perspective view of the connector of FIG. 1.
Figure 4:
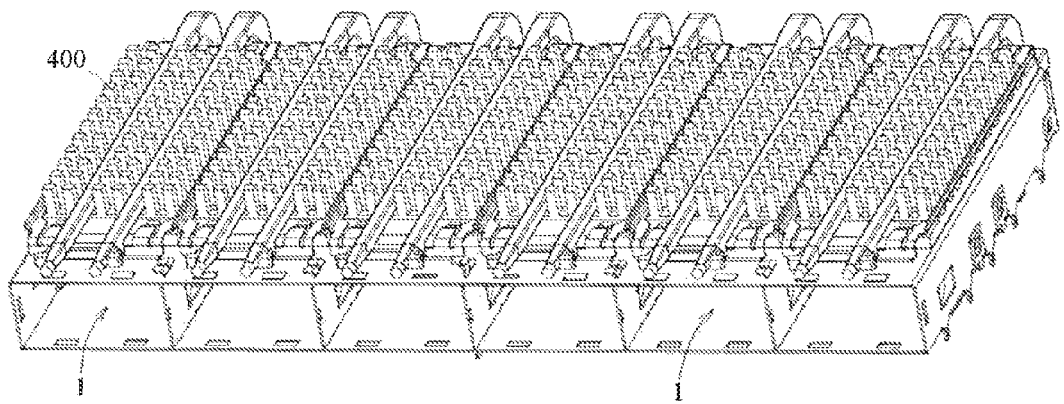
FIG. 4 is another perspective view of a known connector, wherein all temperature exchange devices mounted on all ports are shown.
Figure 5:
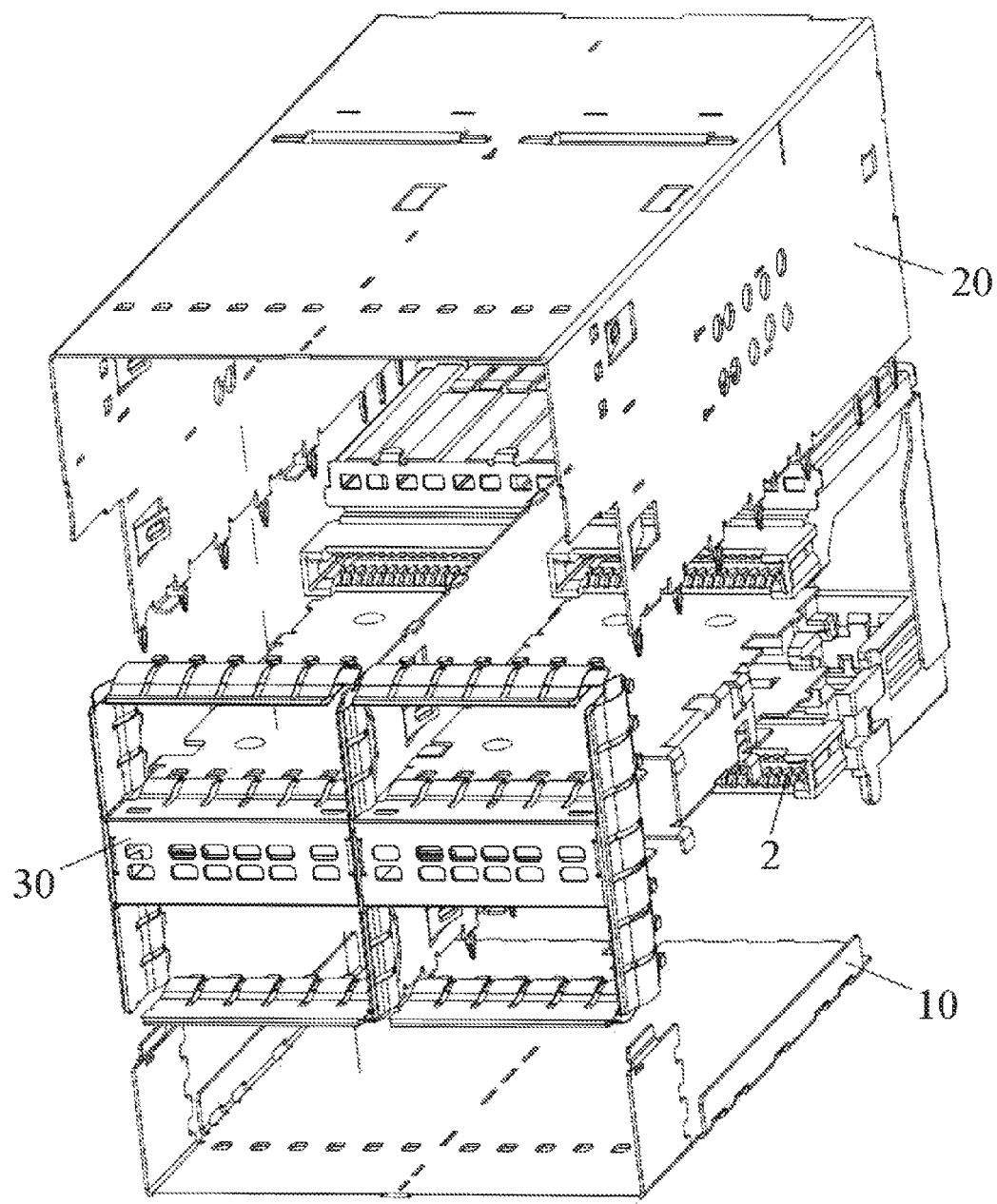
FIG. 5 is an exploded perspective view of another known connector having a plurality of layers of ports.
Figure 6:
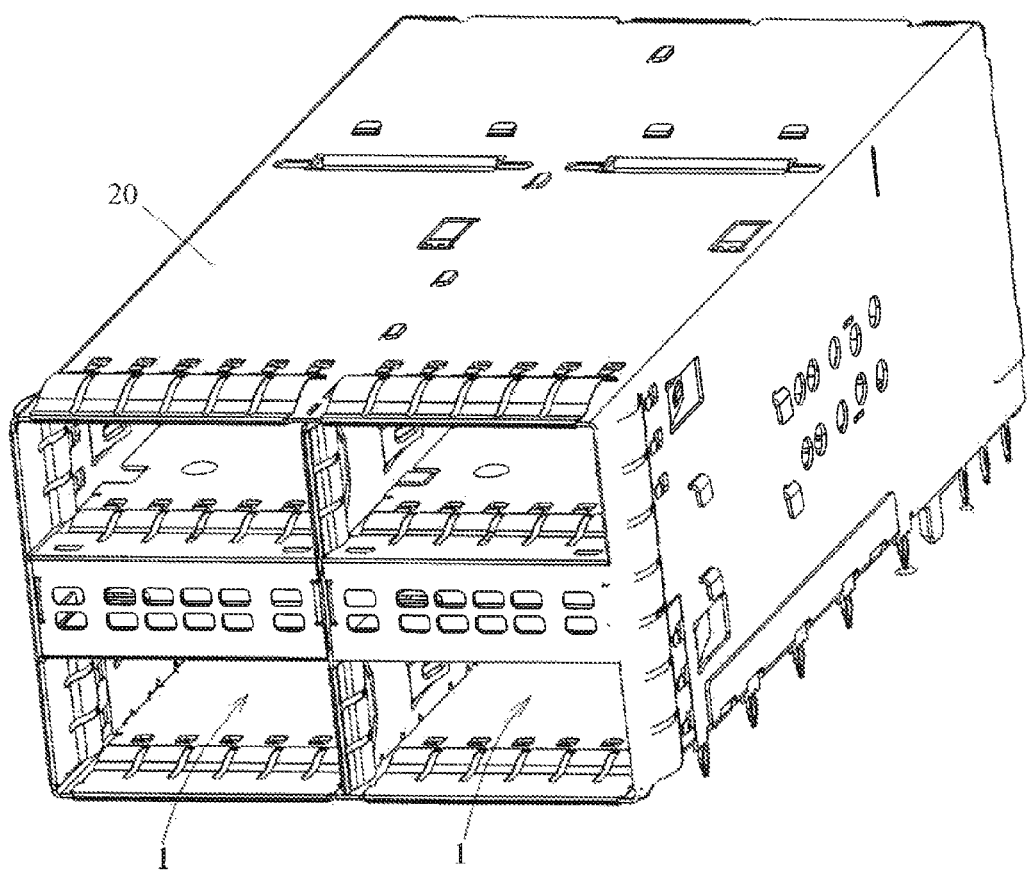
FIG. 6 is an assembled perspective view of the known connector of FIG. 5.

Exemplary embodiments of the present disclosure will be described hereinafter in detail with reference to the attached drawings, wherein the like reference numerals refer to the like elements. The present disclosure may, however, be embodied in many different forms and should not be construed as being limited to the embodiment set forth herein; rather, these embodiments are provided so that the present disclosure will be thorough and complete, and will fully convey the concept of the disclosure to those skilled in the art.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

According to a general concept of the invention, a connector is provided and adapted to mount on a first surface of a circuit board.

Figure 7:
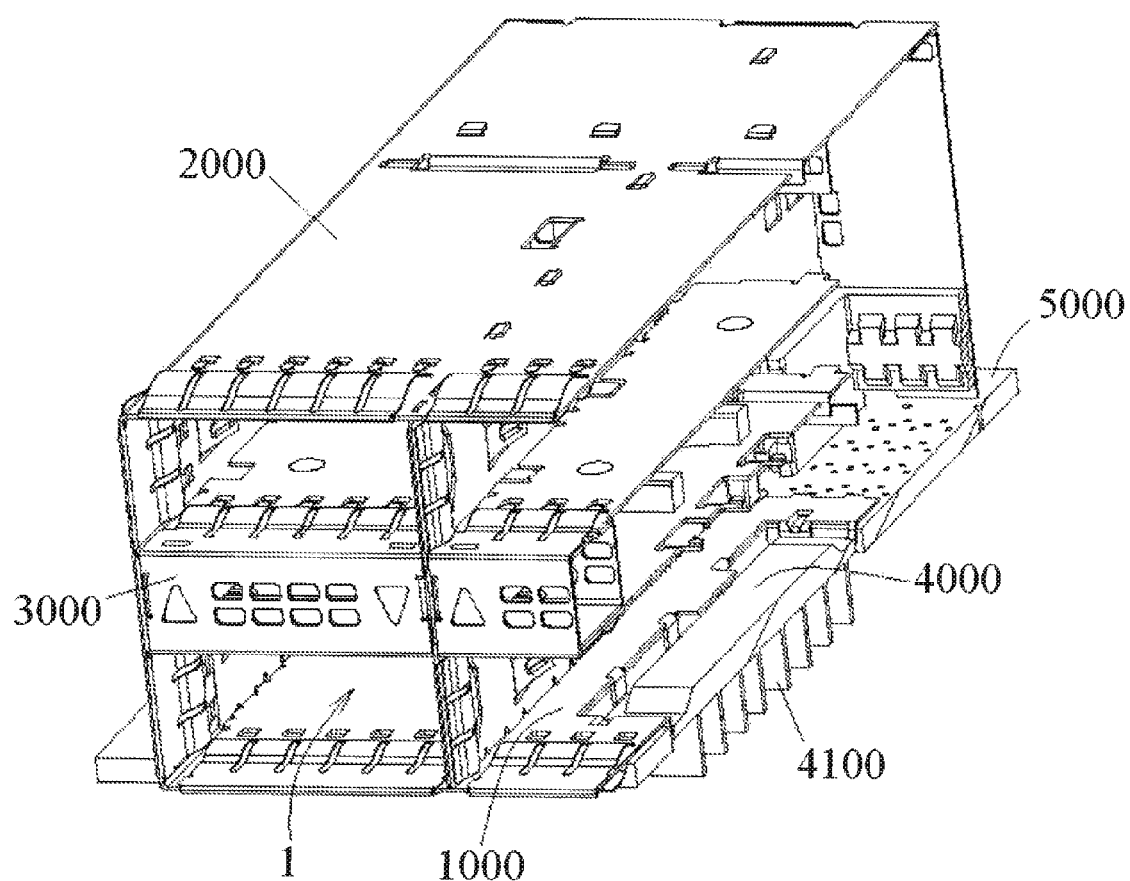
FIG. 7 is a perspective view of a connector according to the invention.

As shown in FIG. 7, a connector according to the invention is shown and includes a bottom case 1000 facing a first surface (upper surface) the circuit board 5000, a top case 2000 located above the bottom case 1000, and a plurality of partitions 3000 disposed between the top case 2000 and the bottom case 1000 to divide an inner space defined between the top case 2000 and the bottom case 1000 into a plurality of ports 1. In the shown embodiment, the connector includes two layers of ports 1. The connector is mounted on a circuit board 5000, and a part of the connector is removed to show a temperature exchange device 4000 mounted on a bottom case 1000 of the connector. In the shown embodiment, the plurality of ports 1 are arranged in two layers, and each layer of ports 1 includes two ports 1.

As shown in FIG. 7, in an exemplary embodiment, the temperature exchange device 4000 includes a plurality of fins 4100. The fins 4100 of the temperature exchange device 4000 pass through a receiving opening 5100 (see FIG. 12) formed in the circuit board 5000 to protrude from a second surface (lower surface) of the circuit board 5000 opposite to the first surface.

Please be noted that the invention is not limited to the illustrated embodiment of FIG. 7, the connector may include only one layer of port (referring to FIGS. 1-4), that is, the temperature exchange device 4000 may be directly mounted on the bottom case 100 of the connector with a single layer of ports shown in FIGS. 1-4.

Figure 9:
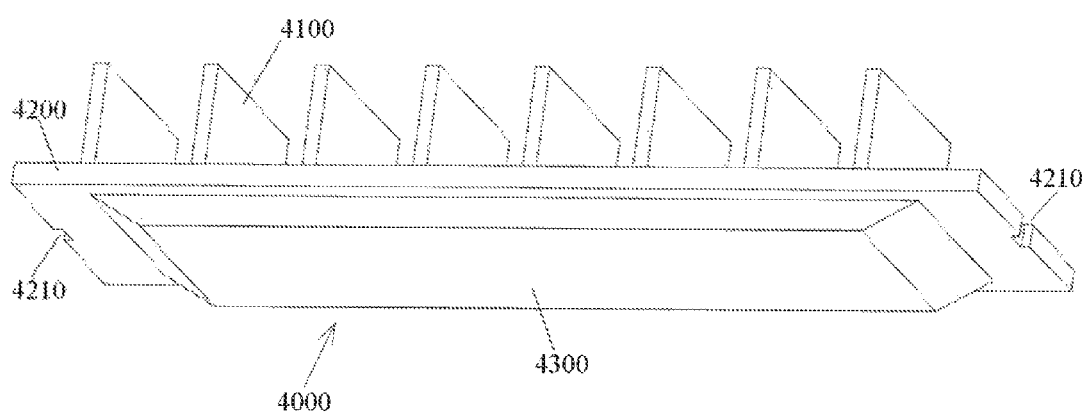
FIG. 9 is a perspective view of the temperature exchange device shown in FIG. 7.

As shown in FIG. 9, the temperature exchange device 4000 further includes a base plate 4200, the plurality of fins 4100 being formed on one surface of the base plate 4200; and a boss 4300 formed on the other surface of the base plate 4200 opposite to the one surface.

Figure 8:
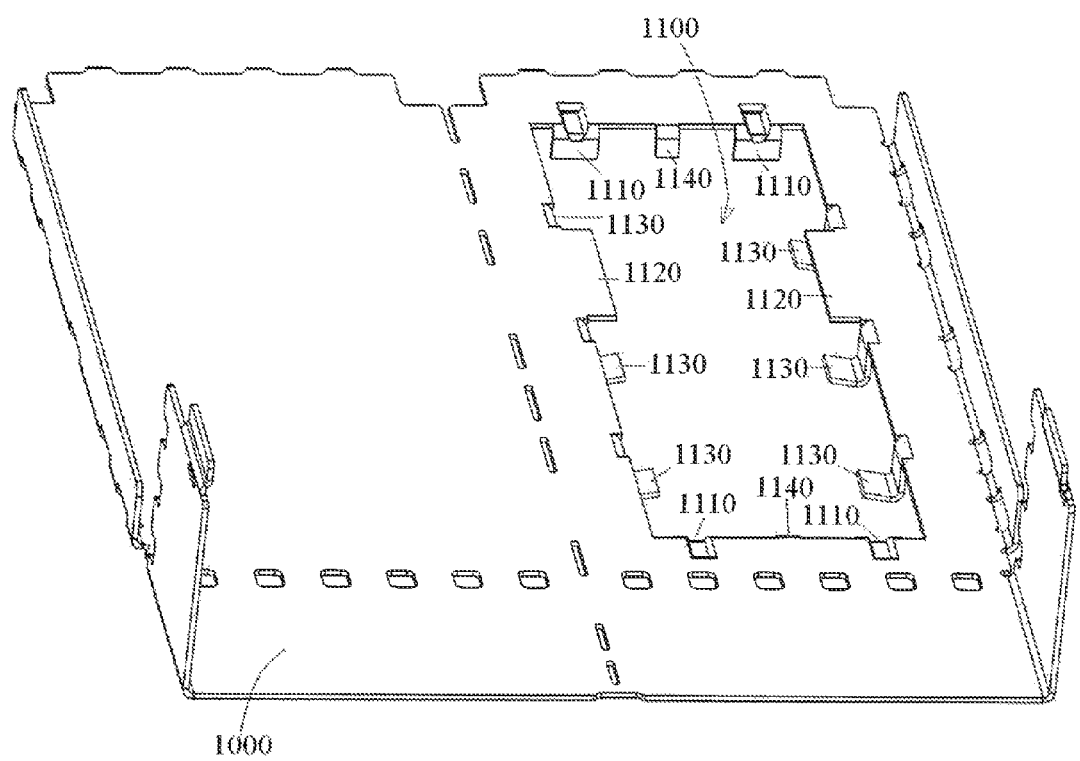
FIG. 8 is a perspective view of a bottom case of the connector case shown in FIG. 7.
Figure 10:
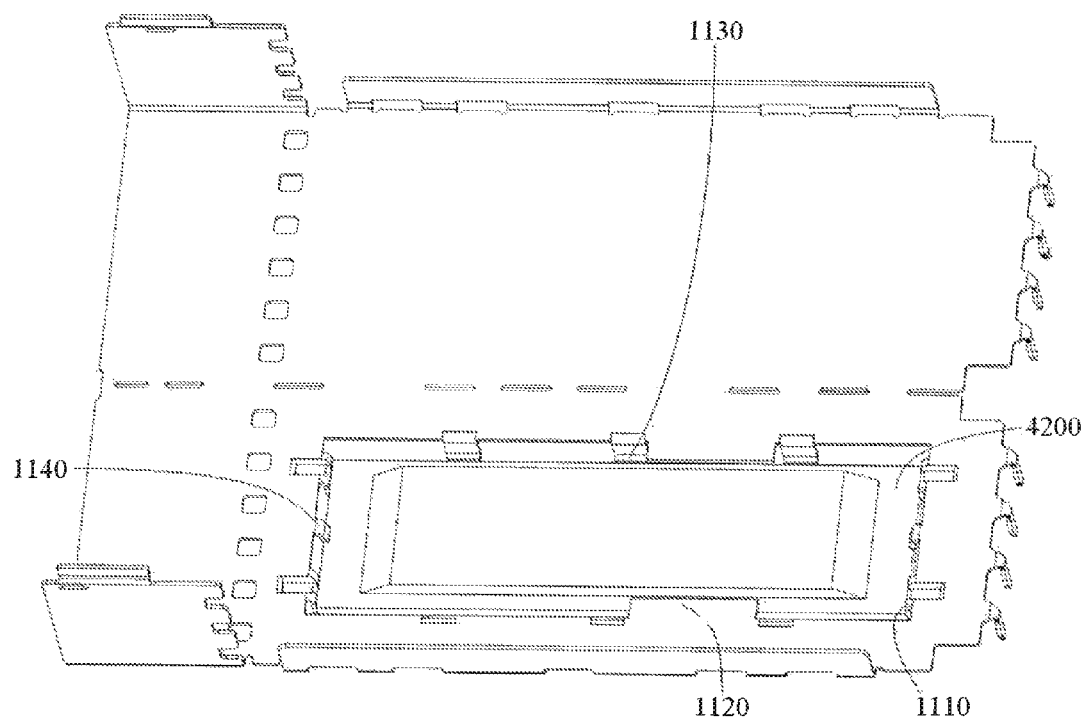
FIG. 10 is a perspective view of mounting the temperature exchange device of FIG. 9 on the bottom case of FIG. 8.

As shown in FIGS. 8-10, a temperature exchange device receiving section 1100 is formed in the bottom case 1000, and the base plate 4200 of the temperature exchange device 4000 is mounted in the temperature exchange device receiving section 1100 of the bottom case 1000.

As shown in FIG. 7, the boss 4300 of the temperature exchange device 4000 passes through the temperature exchange device receiving section 1100 and protrudes into the port 1, so as to contact a mating connector (not shown) inserted into the port 1.

Referring to FIGS. 8-10, an elastic holding member 1130 is formed on an inner edge of the temperature exchange device receiving section 1100 of the bottom case 1000. The elastic holding member 1130 is configured to elastically hold the base plate 4200 of the temperature exchange device 4000 in the temperature exchange device receiving section 1100, so that the temperature exchange device 4000 is movable within a predetermined range in a thickness direction of the base plate 4200 against elastic forces of the elastic holding members 1130.

As shown in FIGS. 8, 10, 12 and 13, after the connector is mounted on the circuit board 5000, the elastic holding member 1130 abuts against a long edge of the receiving opening 5100 in the circuit board 5000, and a cantilever part of the elastic holding member 1130 is supported on the circuit board 5000, enhancing the overall strength of the elastic holding member 1130.

As shown in FIGS. 8-10, a plurality of positioning members (1110, 1120, 1140) are formed on the inner edges of the temperature exchange device receiving section 1100 of the bottom case 1000. The positioning members 1110, 1120, and 1140 are configured to position the temperature exchange device 4000 in place.

As shown in FIG. 8, the temperature exchange device receiving section 1100 is formed in a substantially rectangular shape with a pair of opposite short edges and a pair of opposite long edges. The positioning members (1110, 1120, 1140) include a stopping piece 1110 and a foldable tongue piece 1140 formed on each short edge of the temperature exchange device receiving section 1100, and a protruding piece 1120 formed on each long edge of the temperature exchange device receiving section 1100.

As shown in FIG. 9, a notch 4210 is formed in each of end portions of the base plate 4200.

As shown in FIG. 10, the stopping pieces 1110 are configured to abut against the end portions of the base plate 4200 to limit a movement of the base plate 4200 in a length direction thereof. The foldable tongue pieces 1140 are configured to be fitted into the notches 4210 formed in the end portions of the base plate 4200 and limit a movement of the base plate 4200 in a width direction thereof. A long edge of the base plate 4200 is held between the elastic holding members 1130 and the protruding pieces 1120 to limit a movable distance of the base plate 4200 in the thickness direction thereof.

As shown in FIG. 8, the elastic holding members 1130 are a hooked elastic piece. A plurality of elastic holding members 1130 are formed on each long edge of the temperature exchange device receiving section 1100, and evenly spaced from each other. A pair of stopping pieces 1110 and one foldable tongue piece 1140 are formed on each short edge of the temperature exchange device receiving section 1100, and the one foldable tongue piece 1140 is located between the pair of stopping pieces 1110.

As show in FIG. 8, in an exemplary embodiment, the elastic holding members 1130 and the positioning members (1110, 1120, 1140) are integrally formed on the bottom case 1000 and manufactured by punching the bottom case 1000.

FIGS. 11A-11E are illustrative in showing a process of mounting the temperature exchange device 4000 of FIG. 9 with the temperature exchange device receiving section 1100 in the bottom case 1000 of FIG. 8.

Figure 11A:
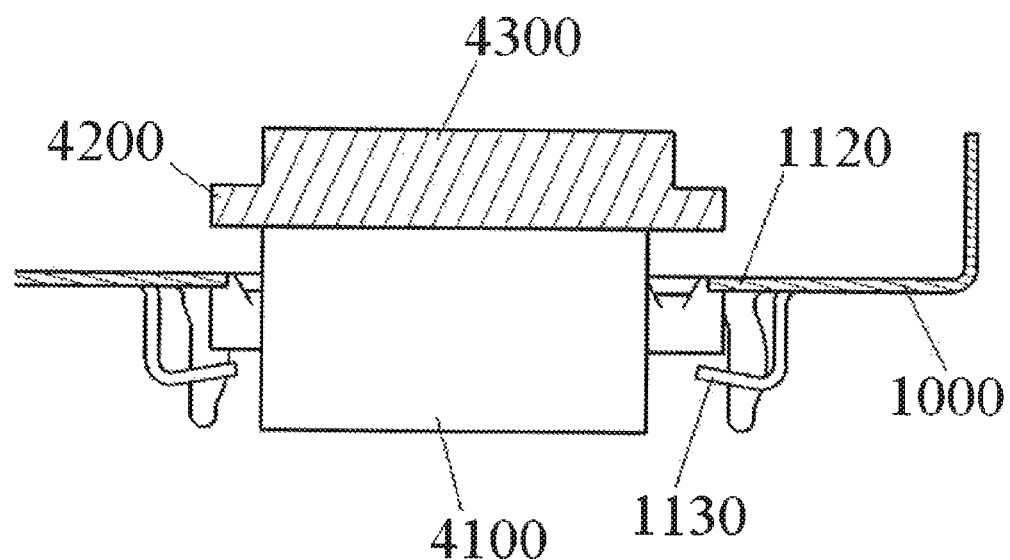
FIG. 11A is a sectional view showing a process of mounting the temperature exchange device on the bottom case.

Firstly, as shown in FIG. 11A, the fin 4100 of the temperature exchange device 4000 is installed in the temperature exchange device receiving section 1100 of the bottom case 1000.

Figure 11B:
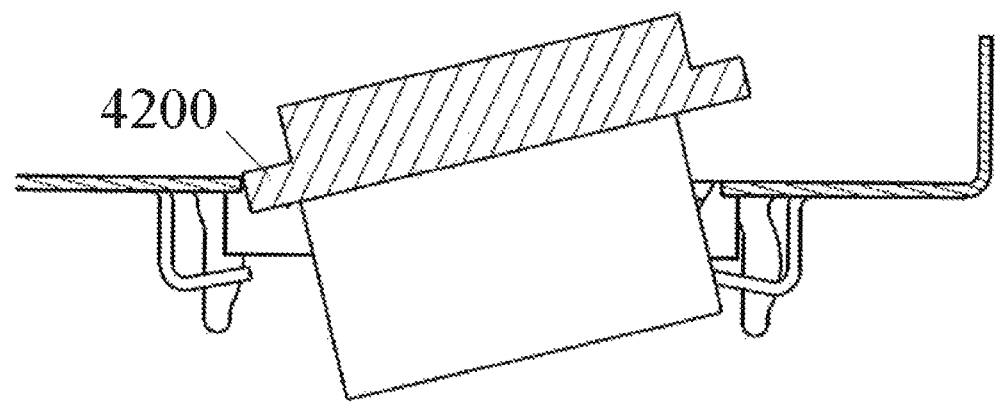
FIG. 11B is another sectional view showing a process of mounting the temperature exchange device on the bottom case.
Figure 11C:
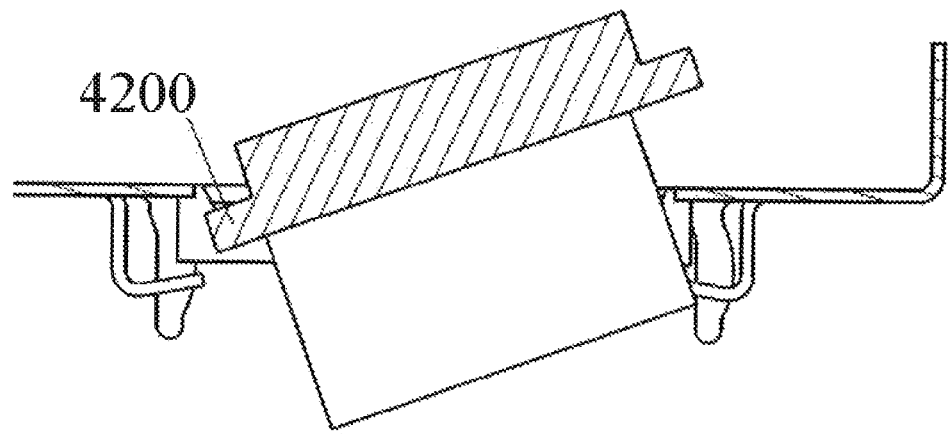
FIG. 11C is another sectional view showing a process of mounting the temperature exchange device on the bottom case.

Secondly, as shown in FIGS. 11B-11C, the temperature exchange device 4000 is tilted in order to interpose one side (left side in FIGS. 11B-11C) of the base plate 4200 of the temperature exchange device 4000 between the elastic holding members 1130 and the protruding piece 1120 of the bottom case 1000.

Figure 11D:
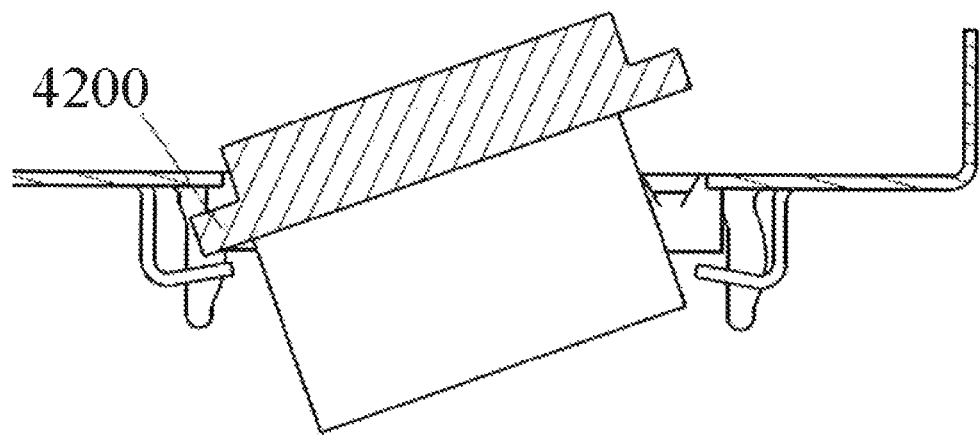
FIG. 11D is another sectional view showing a process of mounting the temperature exchange device on the bottom case.
Figure 11E:
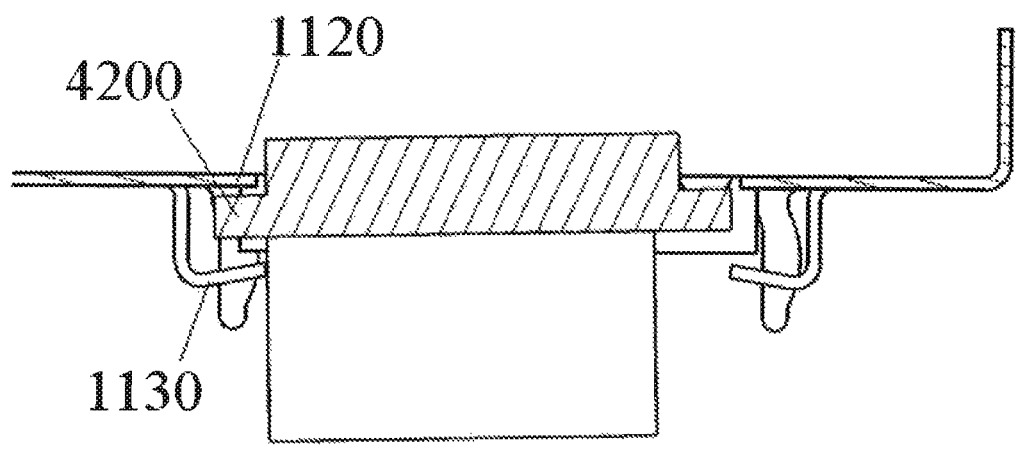
FIG. 11E is another sectional view showing a process of mounting the temperature exchange device on the bottom case.

Thirdly, as shown in FIGS. 11D-11E, the temperature exchange device 4000 is moved leftward and rotated to interpose the other side (right side in FIGS. 11D-11E) of the base plate 4200 of the temperature exchange device 4000 between the elastic holding members 1130 and the protruding pieces 1120 of the bottom case 1000. Then the temperature exchange device 4000 is moved rightward.

Finally, as shown in FIG. 10, the foldable tongue piece 1140 is bent and fit in the notches 4210 in the end portions of the base plate 4200 of the temperature exchange device 4000, respectively.

In this way, the temperature exchange device 4000 is mounted in the temperature exchange device receiving section 1100 of the bottom case 1000.

Figure 12:
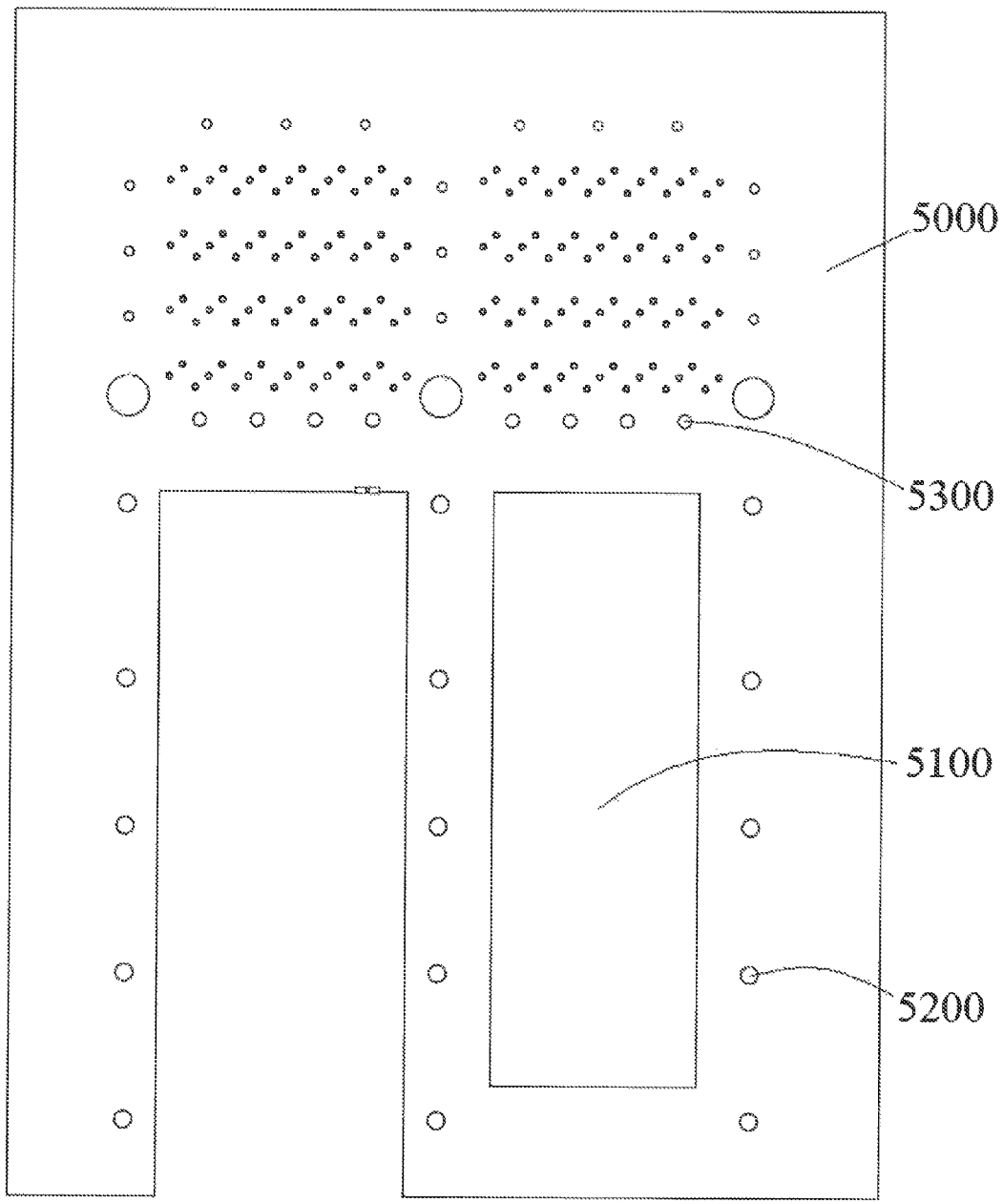
FIG. 12 is a planar local view of the circuit board of FIG. 7.
Figure 13:
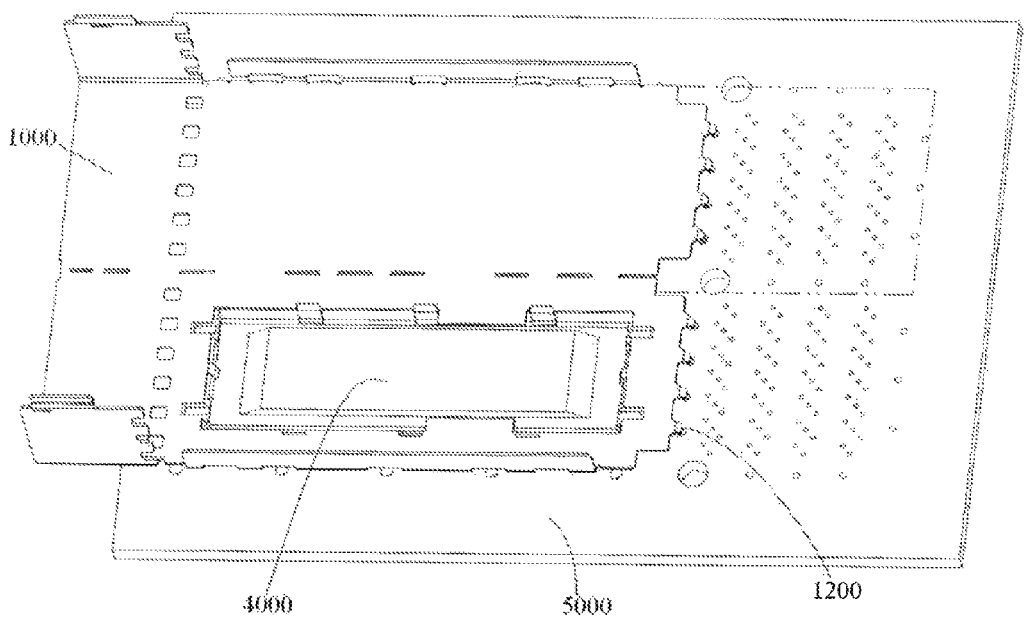
FIG. 13 is a perspective view of mounting the bottom case (with the temperature exchange device thereon) of FIG. 10 on the circuit board of FIG. 12.

As shown in FIGS. 12-13, pin receiving passageways 5200 mated with pins (not shown) of the top case 2000 and pin receiving passageways 5300 mated with pins 1200 (see FIG. 13) of the bottom case 1000 are formed in the circuit board 5000 around the opening 5100.

Figure 14:
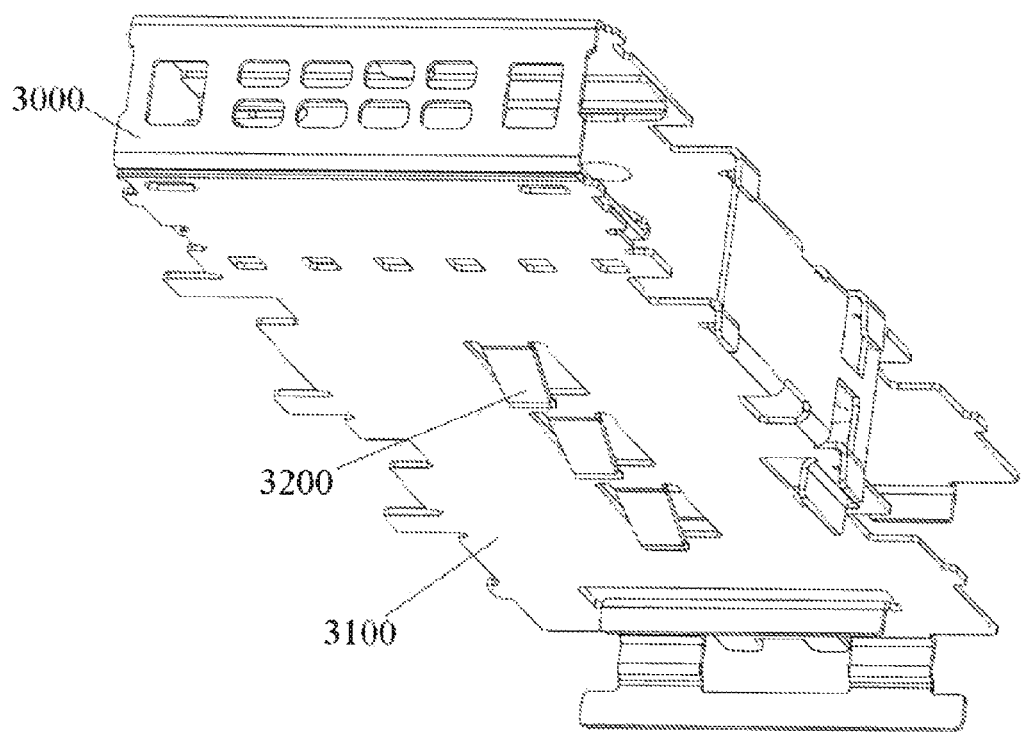
FIG. 14 is a perspective view of a partition of the connector of FIG. 7.

With respect to FIG. 14, a partition 3000 is shown and includes a spring 3200 is formed on a surface 3100 of the partition 3000 facing the bottom case 1000 and configured to exert a spring force on the mating connector that is to be inserted into the port 1. In this way, a contact force between the temperature exchange device 4000 mounted on the bottom case 1000 and the mating connector inserted into the connector is enhanced, so that the temperature exchange device 4000 can reliably and tightly contact the mating connector, increasing the heat conducting effect between the mating connector and the temperature exchange device 4000.

Similarly, if the connector includes only a single layer of ports, as shown in FIGS. 1-4, a spring may be formed on an inner surface of the top case, so as to exert a spring force on the mating connector inserted into the port.

In an exemplary embodiment, the temperature exchange device 4000 may be mounted on a location of the bottom case 1000 corresponding to each port 1.

In an exemplary embodiment, an additional temperature exchange device, for example the temperature exchange device 400 shown in FIGS. 1-4, is mounted on an outer surface of the top case. As shown in FIGS. 1-4, the additional temperature exchange device 400 is held on the outer surface of the top case 200 by means of a spring clamp 500, and the light guide pipe 600 is mounted on the additional temperature exchange device 400.

In an exemplary embodiment, the connector is a female Small Form Factor (SFF) connector. The top case, the bottom case and the partition are made of metal.

In another exemplary embodiment, as shown in FIG. 7, there is also provided a connector assembly. As shown in FIG. 7, the connector assembly includes a circuit board 5000 having a first surface and a second surface opposite to the first surface and formed with an opening 5100 therein, and the above connector set forth in the embodiments. The connector is mounted on the first surface of the circuit board 5000, and the temperature exchange device 4000 passes through the opening 5100 and protrudes from the second surface of the circuit board 5000.

In another exemplary embodiment, an electrical apparatus (not shown) is also provided. The electrical apparatus includes a housing as well as a connector assembly set forth in the aforementioned embodiments. The circuit board 5000 of the connector assembly is assembled in the housing, and the fin 4100 of the temperature exchange device 4000 is located in a space between the second surface of the circuit board 5000 and an inner wall surface of the housing.

Generally, the circuit board is mounted in the housing of the electrical apparatus, and the connector is mounted on the circuit board. In this case, in order to prevent metal soldering joints and metal pins of elements on the circuit bottom from contacting the metal housing of the electrical apparatus, there is always a space between the bottom of the circuit board and the inner wall of the housing, and the space between the bottom of the circuit board and the inner wall of the housing is large enough to receive the fin of the temperature exchange device therein. In this way, an additional heat radiating passage between the bottom case of the connector and the housing of the electrical apparatus is built up, improving the heat radiating effect for the connector.

It should be appreciated for those skilled in this art that the above embodiments are intended to be illustrated, and not restrictive. For example, many modifications may be made to the above embodiments by those skilled in this art, and various features described in different embodiments may be freely combined with each other without conflicting in configuration or principle.

Although several exemplary embodiments have been shown and described, it would be appreciated by those skilled in the art that various changes or modifications may be made in these embodiments without departing from the principles and spirit of the disclosure, the scope of which is defined in the claims and their equivalents.

As used herein, an element recited in the singular and proceeded with the word "a" or "an" should be understood as not excluding plural of said elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

What is claimed is:

1. A connector, comprising:
    a bottom case having a temperature exchange device receiving section that is rectangular shaped with a pair of opposite short edges and a pair of opposite long edges and a plurality of elastic holding members positioned along a perimeter of the temperature exchange device receiving section;
    a top case positioned above the bottom case;
    a partition positioned between the top case and the bottom case;
    a spring disposed on a surface of the partition facing the bottom case;
    a plurality of ports positioned between the top case and the bottom case and separated by the partition; and
    a temperature exchange device mounted on the bottom case and having a boss passing through the temperature exchange device receiving section and protruding into one of the plurality of ports.

2. The connector according to claim 1, wherein the bottom case is mounted on a first surface of a circuit board.

3. The connector according to claim 2, wherein the temperature exchange device passes through an opening in the circuit board that extends through a second surface of the circuit board positioned opposite to the first surface.

4. The connector according to claim 1, wherein the temperature exchange device includes a base plate with a plurality of fins formed on a first surface of the base plate.

5. The connector according to claim 4, wherein the boss is formed on a second surface of the base plate.

6. The connector according to claim 1, wherein each of the plurality of elastic holding members is hook shaped.

7. The connector according to claim 6, wherein the plurality of elastic holding members are disposed along the pair of opposite long edges and evenly spaced from each other.

8. The connector according to claim 7, wherein the plurality of elastic holding members are integrally formed with the bottom case by punching.

9. The connector according to claim 1, further comprising a plurality of positioning members disposed on the perimeter and spaced apart from the plurality of elastic holding members.

10. The connector according to claim 9, wherein each of the plurality of positioning members has a pair of stopping pieces formed on each of the pair of opposite short edges.

11. The connector according to claim 10, further comprising a foldable tongue located between the pair of stopping pieces.

12. The connector according to claim 11, further comprising a protruding piece disposed on each of the pair of opposite long edges.

13. The connector according to claim 1, further comprising a spring disposed on an inner surface of the top case.

14. The connector according to claim 1, further comprising a light guide mounted on the temperature exchange device.

15. A connector, comprising:
    a bottom case having a temperature exchange device receiving section and a plurality of hook shaped elastic holding members positioned on a bottom surface of the bottom case along a perimeter of the temperature exchange device receiving section;
    a top case positioned above the bottom case;
    a partition positioned between the top case and the bottom case;
    a plurality of ports positioned between the top case and the bottom case and separated by the partition; and
    a temperature exchange device mounted on the bottom case.

16. The connector according to claim 15, wherein the plurality of elastic holding members are disposed along the pair of opposite long edges and evenly spaced from each other.

17. The connector according to claim 16, wherein the plurality of elastic holding members are integrally formed with the bottom case by punching.

18. A connector, comprising:
    a bottom case having a temperature exchange device receiving section, a plurality of elastic holding members positioned on a bottom surface of the bottom case along a perimeter of the temperature exchange device receiving section, and a plurality of positioning members disposed on the perimeter and spaced apart from the plurality of elastic holding members;
    a top case positioned above the bottom case;
    a partition positioned between the top case and the bottom case;
    a plurality of ports positioned between the top case and the bottom case and separated by the partition; and
    a temperature exchange device mounted on the bottom case.

19. The connector according to claim 18, wherein each of the plurality of positioning members has a pair of stopping pieces formed on each of the pair of opposite short edges.

20. The connector according to claim 19, further comprising a foldable tongue located between the pair of stopping pieces.

21. The connector according to claim 20, further comprising a protruding piece disposed on each of the pair of opposite long edges.

* * * * *